(12) United States Patent
Wang et al.

(10) Patent No.: US 12,191,636 B2
(45) Date of Patent: Jan. 7, 2025

(54) VERTICAL CAVITY SURFACE EMITTING LASER (VCSEL) ARRAY AND MANUFACTURING METHOD

(71) Applicant: Shenzhen Raysees AI Technology Co. Ltd., Shenzhen (CN)

(72) Inventors: Yang Wang, Dublin, CA (US); Yongxiang He, Sunnyvale, CA (US)

( * ) Notice: Subject to any disclaimer, the term of this patent is extended or adjusted under 35 U.S.C. 154(b) by 939 days.

(21) Appl. No.: 17/294,463

(22) PCT Filed: Sep. 25, 2018

(86) PCT No.: PCT/CN2018/107364
§ 371 (c)(1),
(2) Date: May 17, 2021

(87) PCT Pub. No.: WO2020/061752
PCT Pub. Date: Apr. 2, 2020

(65) Prior Publication Data
US 2022/0013992 A1    Jan. 13, 2022

(51) Int. Cl.
*H01S 5/42*        (2006.01)
*H01S 5/02251*    (2021.01)
*H01S 5/0234*     (2021.01)
*H01S 5/183*      (2006.01)
*H01S 5/34*       (2006.01)

(52) U.S. Cl.
CPC .......... *H01S 5/423* (2013.01); *H01S 5/02251* (2021.01); *H01S 5/0234* (2021.01); *H01S 5/18361* (2013.01); *H01S 5/34* (2013.01)

(58) Field of Classification Search
CPC .... H01S 5/423; H01S 5/02251; H01S 5/0234; H01S 5/18361; H01S 5/34; H01S 5/02345; H01S 5/02253; H01S 5/02257; H01S 2301/176; H01S 5/04256; H01S 5/026
See application file for complete search history.

(56) References Cited

U.S. PATENT DOCUMENTS

| 2003/0007257 | A1* | 1/2003 | Bell, Jr. | H01S 5/0267 359/618 |
| 2009/0305447 | A1* | 12/2009 | Guenter | H01S 5/18308 438/45 |
| 2012/0051384 | A1 | 3/2012 | Geske et al. | |
| 2012/0293625 | A1 | 11/2012 | Schneider et al. | |

(Continued)

FOREIGN PATENT DOCUMENTS

| CN | 1612433 A | 5/2005 |
| CN | 102709808 A | 10/2012 |

(Continued)

OTHER PUBLICATIONS

Office action issued Nov. 2, 2022, in Chinese patent application No. 201880099647.0 (with English language translation by sipo).

*Primary Examiner* — Xinning(Tom) Niu
(74) *Attorney, Agent, or Firm* — Jigang Jin

(57) ABSTRACT

A VCSEL array and the method of manufacturing the array are disclosed. The VCSEL array comprises a substrate and a plurality of VCSEL structures formed on the substrate in a regular pattern. A customized metal layer is deposited to electrically connect a selected number but not all of the plurality of VCSEL structures. The selected number of VCSEL structures form an array of a predetermined irregular pattern.

19 Claims, 7 Drawing Sheets

(56) References Cited

U.S. PATENT DOCUMENTS

| | | |
|---|---|---|
| 2013/0163627 A1 | 6/2013 | Seurin et al. |
| 2013/0272330 A1 | 10/2013 | Joseph et al. |
| 2015/0340841 A1* | 11/2015 | Joseph ................ H01S 5/04257 |
| | | 372/50.12 |
| 2016/0328091 A1* | 11/2016 | Wassvik .................. H01S 5/423 |
| 2016/0352074 A1 | 12/2016 | Hogan et al. |
| 2019/0109436 A1* | 4/2019 | Hegblom ................ H01S 5/423 |
| 2020/0381890 A1* | 12/2020 | Hogan .................. H01S 5/0239 |

FOREIGN PATENT DOCUMENTS

| | | |
|---|---|---|
| CN | 10317844 A | 6/2013 |
| CN | 208368943 U | 1/2019 |
| EP | 1501162 A2 | 1/2015 |
| JP | 2007027362 A | 2/2007 |

\* cited by examiner

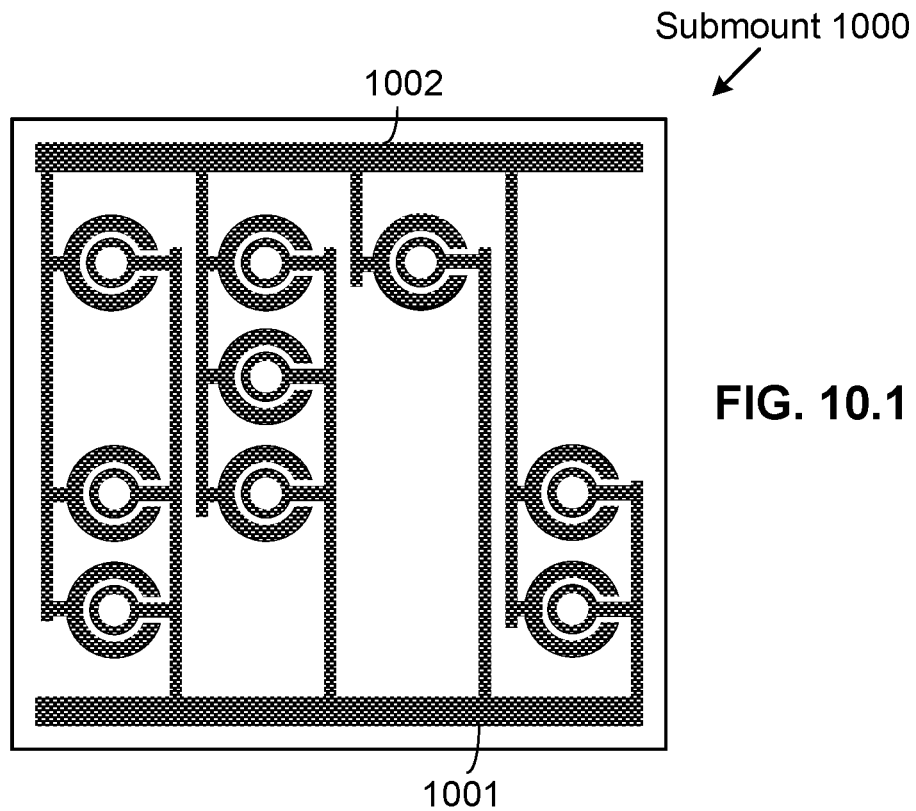
FIG. 10.1
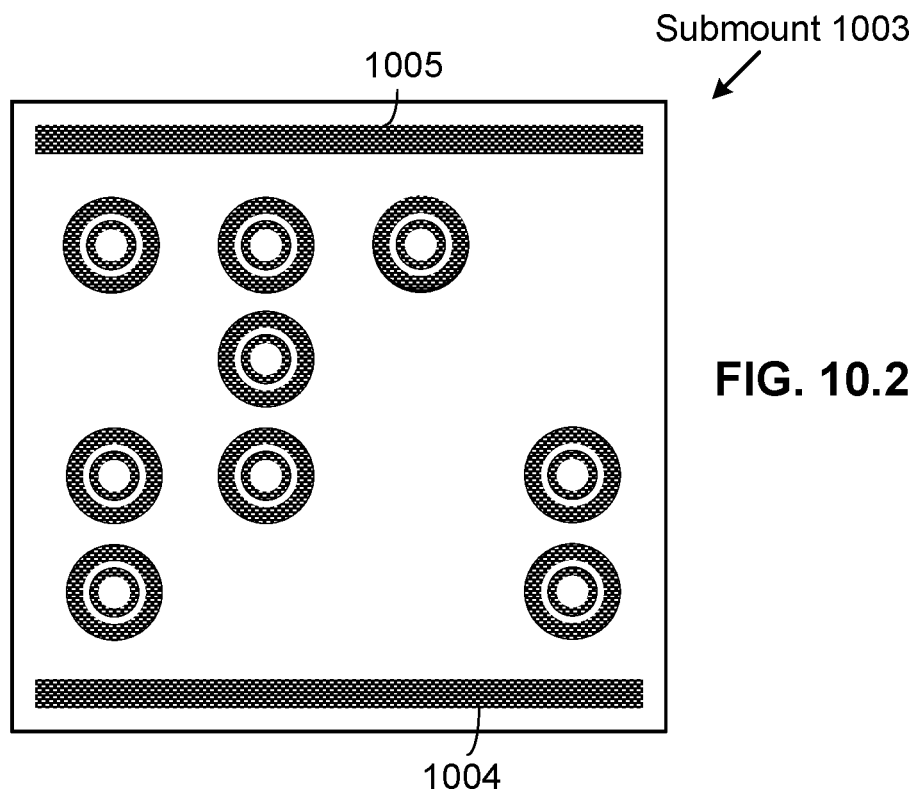
FIG. 10.2

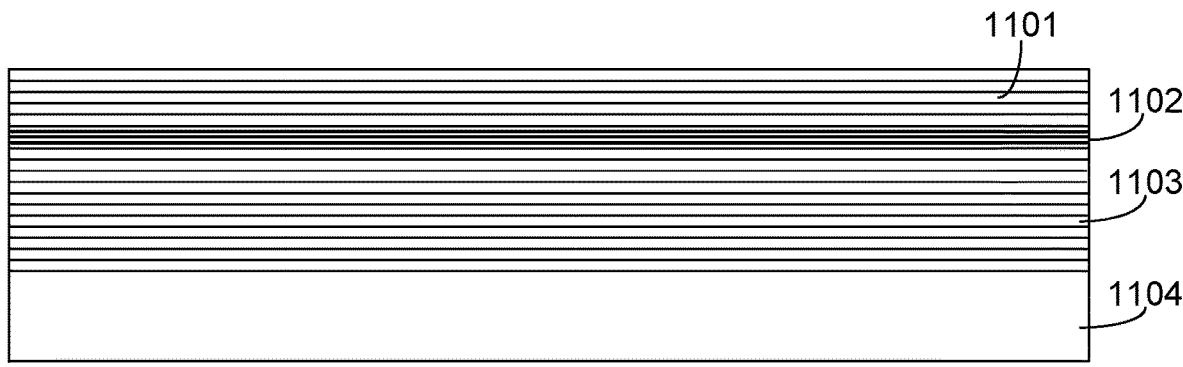
FIG. 11.1 (Prior Art)
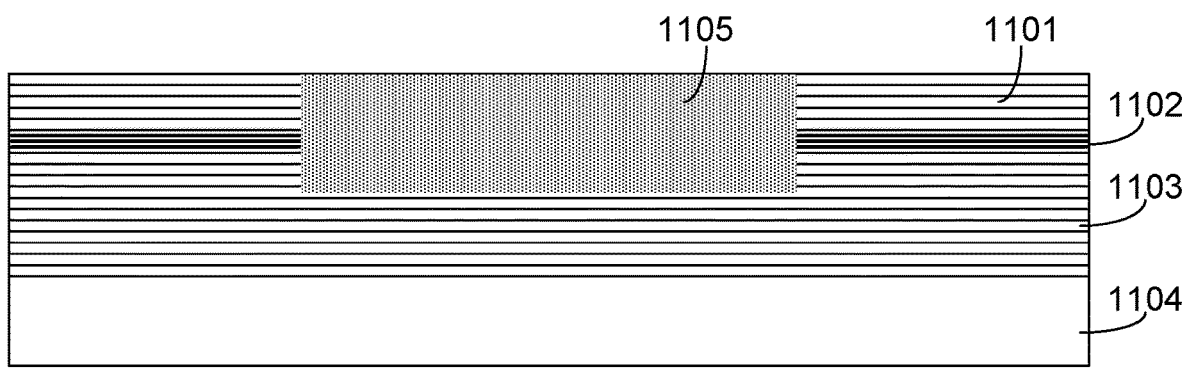
FIG. 11.2 (Prior Art)
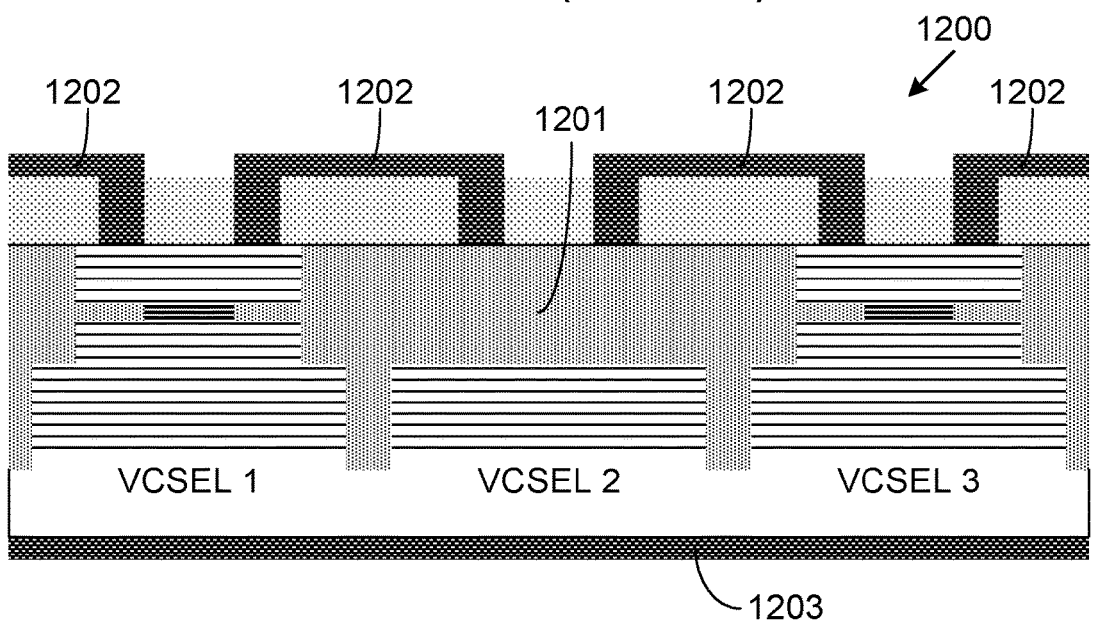
FIG. 12

VERTICAL CAVITY SURFACE EMITTING LASER (VCSEL) ARRAY AND MANUFACTURING METHOD

CROSS-REFERENCE TO RELATED APPLICATIONS

This application is the U.S. National Stage of International Application No. PCT/CN2018/107364, filed Sep. 25, 2018, the content of which is incorporated herein by reference in its entirety.

TECHNICAL FIELD

This invention generally relates to a Vertical Cavity Surface Emitting Laser (VCSEL) array and to the manufacturing method of VCSEL arrays.

BACKGROUND ART

Three-dimensional (3D) sensing represents a future trend of smartphones. The 3D sensing technology is also expected to enhance the functions of robots, drones, and autonomous vehicles. Compared to conventional cameras which provide two-dimensional information, 3D sensing captures the depth data in addition to a flat image and thus enables accurate facial recognition, object recognition, gesture sensing, and environmental sensing. Moreover, it enhances augmented reality (AR) and virtual reality (VR) capabilities as well. 3D sensing includes the Time-of-Flight (TOF) method and the structured light method. In the TOF approach, the depth data is obtained by measuring the traveling time of light emitted from a light source, reflected from an object, and finally detected by a sensor. In the structured light approach, a predetermined pattern of dots is projected onto an object. The pattern is distorted after it is reflected by the 3D shape of the object. The depth data of the object is calculated by analyzing changes in the pattern. Currently, a preferred pattern of dots for the structured light method is implemented by a VCSEL array. The present invention relates to VCSEL arrays for such applications.

A VCSEL generates an output beam in the direction perpendicular to its top and bottom surfaces. To become a VCSEL array, a VCSEL chip may contain multiple VCSELs which generates multiple output beams. For instance, thousands of VCSELs may be formed on a chip. Thanks to the surface emitting feature, wafer-level processing and surface-mount techniques, which are well developed in the semiconductor industry, can be utilized to manufacture VCSEL array devices in high volume inexpensively. Because of a narrow spectrum and stability with respect to temperature, plus low cost and small size, VCSEL arrays are becoming the dominant light source in 3D sensing implementations.

In illumination applications, VCSEL emitters in a VCSEL array are arranged in a regular pattern. One often used regular pattern is matrix, where the spacing between any two adjacent VCSEL emitters in a row or column is the same. For instance, a 30×30 VCSEL array has thirty emitters in each row and each column and the centers of any two adjacent emitters may be, for instance, a constant value of forty micrometers.

In structured light method of 3D sensing, however, the VCSEL emitters of a VCSEL array are arranged in a predetermined irregular pattern, which is determined by the specific algorithm used in the structured light method. Examples include random and pseudo-random patterns depending on the design. A regular-patterned VCSEL array may be made by the same fabrication method as an irregular-patterned VCSEL array. Take a top-emitting VCSEL array for example. When a regular-patterned VCSEL array is made, VCSELs are formed on a substrate in a regular pattern. The VCSELs share a common cathode terminal and are separated from each other by isolation trenches. A contact is formed on top of each VCSEL. In the last fabrication step(s), a metal layer is deposited above the VCSELs to connect all these top contacts. When an irregular-patterned VCSEL array is made, VCSELs are formed on a substrate in a predetermined irregular pattern. The VCSELs share a common cathode terminal and are separated by isolation trenches. Similarly, a contact is formed on top of each VCSEL. In the last fabrication step(s), a metal layer is deposited to connect all top contacts of the VCSELs. The main difference between making a regular-patterned VCSEL array and making an irregular-patterned VCSEL array is that they use different sets of masks. While the manufacturing process fully utilizes current fabrication techniques and processes, it is limited to only one design of patterned array. Any VCSEL array with a new pattern needs a new set of masks and a separate fabrication process. Lack of flexibility causes difficulties in cost reduction and improvement of turnaround time.

Therefore, there exists a need for a VCSEL array and manufacturing method which are more flexible to adapt to different pattern designs.

SUMMARY OF INVENTION

Technical Problem

As discussed above, in prior art methods, the manufacturing of VCSEL arrays of different patterns, whether regular or irregular, requires completely different sets of masks from the beginning to the end in the fabrication process. This is complex, inefficient, and costly.

SOLUTION TO PROBLEM

Technical Solution

In various embodiments of the present invention, a VCSEL array and the method of manufacturing the array are disclosed. In one embodiment, a VCSEL array comprises a substrate and a plurality of VCSEL structures formed in a regular pattern on the substrate. The VCSEL structures share one electrode (e.g., the cathode terminal) and each have a contact serving as the other electrode (e.g., the anode terminal). A customized metal layer is deposited above the plurality of VCSEL structures to electrically connect the contacts of a selected number but not all of the plurality of VCSEL structures. The selected VCSEL structures form an array of a predetermined irregular pattern.

In another embodiment of the present invention, a VCSEL array comprises a substrate, a plurality of VCSEL structures formed in a regular pattern on the substrate, and an optical component mounted above the plurality of VCSEL structures. The plurality of VCSEL structures share one electrode (e.g., the cathode terminal) and each have a contact serving as the other electrode (e.g., the anode terminal). The optical component has a customized metal layer with contact pads arranged in a mirror image of a predetermined irregular pattern formed on its bottom surface. After the optical component is mounted above the plurality of VCSEL structures, each of the contact pads is electrically bonded with a corresponding contact of a VCSEL structure so that only a selected number but not all of the plurality of VCSEL structures are electrically connected. The VCSEL structures which are connected to the contact pads form an array of the predetermined irregular pattern.

In yet another embodiment, a VCSEL array comprises a plurality of VCSEL structures mounted on a submount via the flip-chip method. The plurality of VCSEL structures are arranged in a regular pattern and share one electrode (e.g., the cathode terminal). Each VCSEL structure has a contact serving as the other electrode (e.g., the anode terminal). The submount has a customized metal layer with contact pads arranged in an image of a predetermined irregular pattern. After the plurality of VCSEL structures are mounted on the submount, each of the contact pads is bonded with a corresponding contact of a VCSEL structure. The VCSEL structures which are connected to the contact pads form an array of the predetermined irregular pattern.

In yet another embodiment of the present invention, a customized method of manufacturing a VCSEL array comprises forming a plurality of VCSEL structures in a regular pattern on a substrate. The plurality of VCSEL structures share one electrode (e.g., the cathode terminal). The method further comprises disabling a selected number but not all of the plurality of VCSEL structures by ion implantation such that the remaining VCSEL structures form an array of a predetermined irregular pattern; etching contacts, each corresponding to one of the plurality of VCSEL structures, including the disabled ones; and depositing a metal layer to electrically connect all contacts.

ADVANTAGEOUS EFFECTS OF INVENTION

Advantageous Effects

The present invention simplifies the manufacturing process by manufacturing regular-patterned VCSEL arrays but without the metallization that completes the connection of all VCSELs; and then customizing these regular-patterned VCSEL arrays into VCSEL arrays of different irregular patterns via customized metallization or packaging. Thus, a major part of the manufacturing process is standardized or unified and only a few manufacturing steps need to be customized. For example, to make VCSEL arrays of different irregular patterns, the same regular-patterned VCSEL arrays are used as the basis for customization. Thus, manufacturing VCSEL arrays of different irregular patterns becomes efficient and less costly.

BRIEF DESCRIPTION OF DRAWINGS

Description of Drawings

Figure 1:
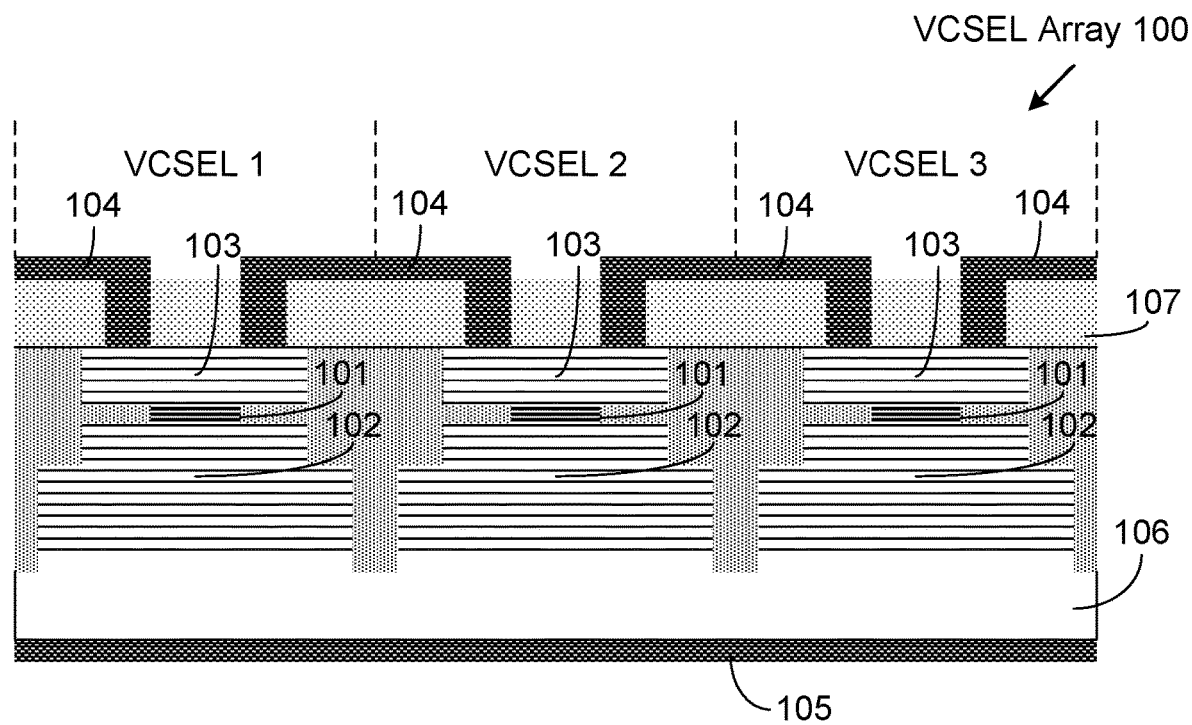

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

Figure 2:
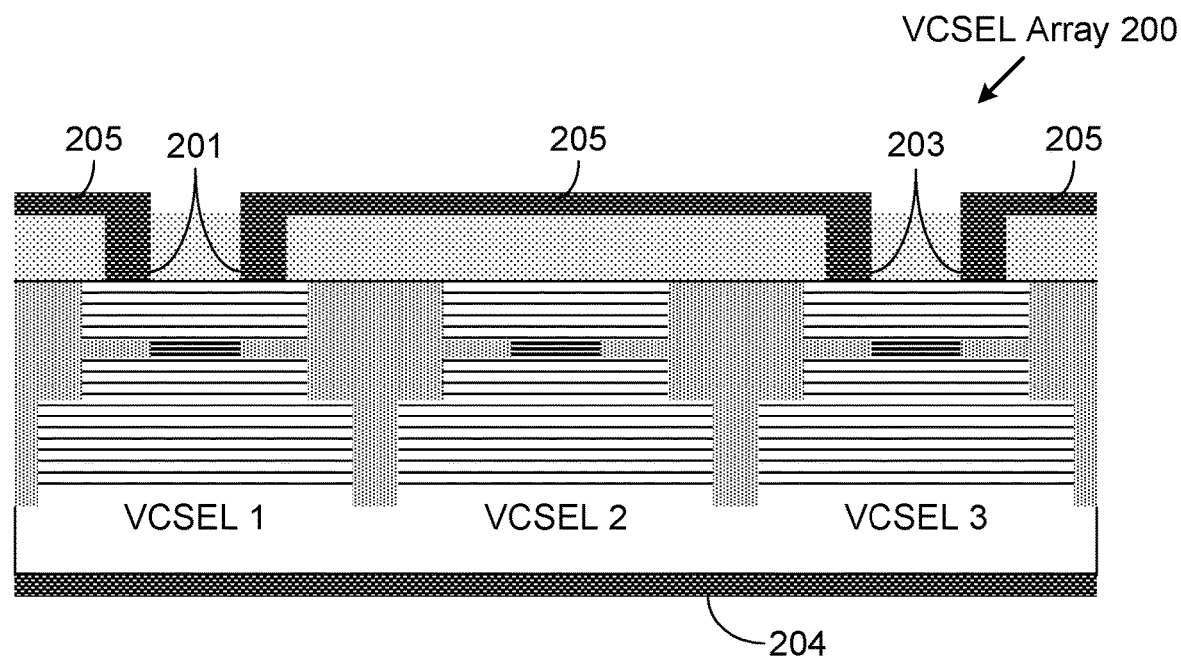
Figure 3:
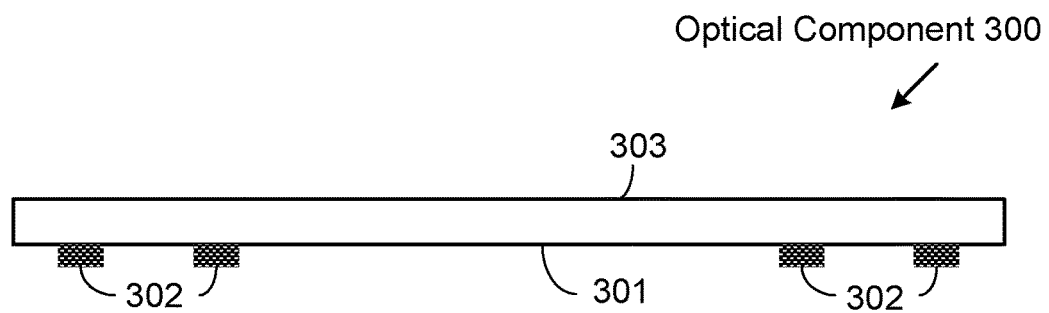
Figure 4:
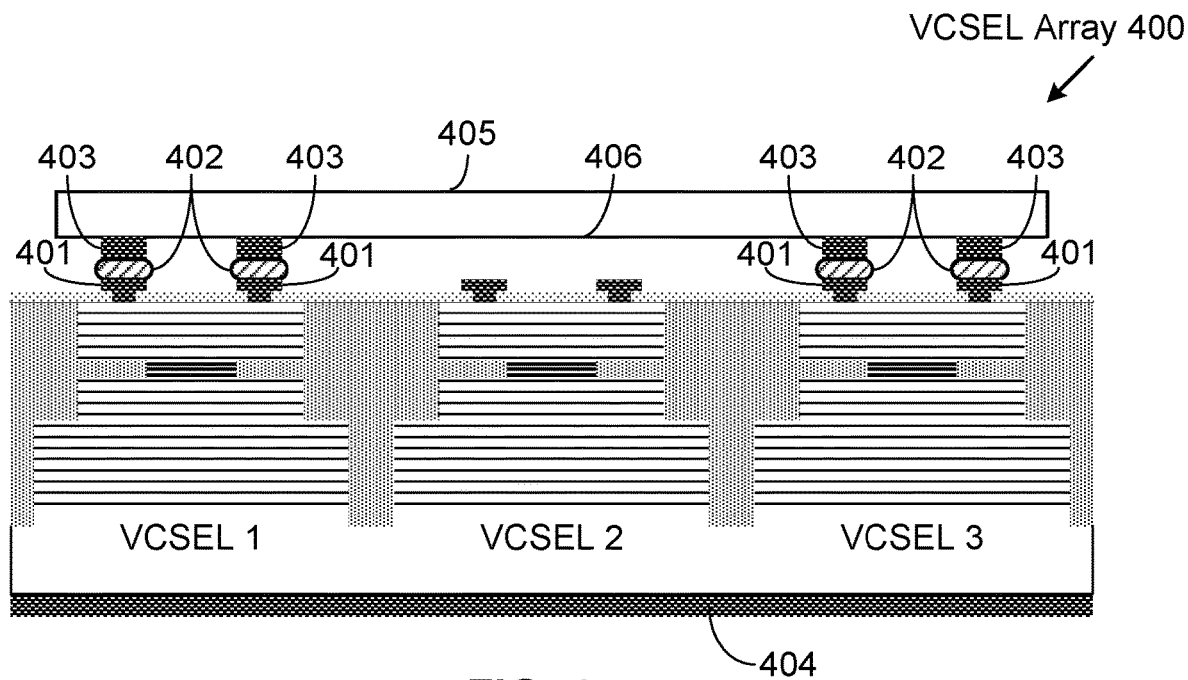
Figure 5:
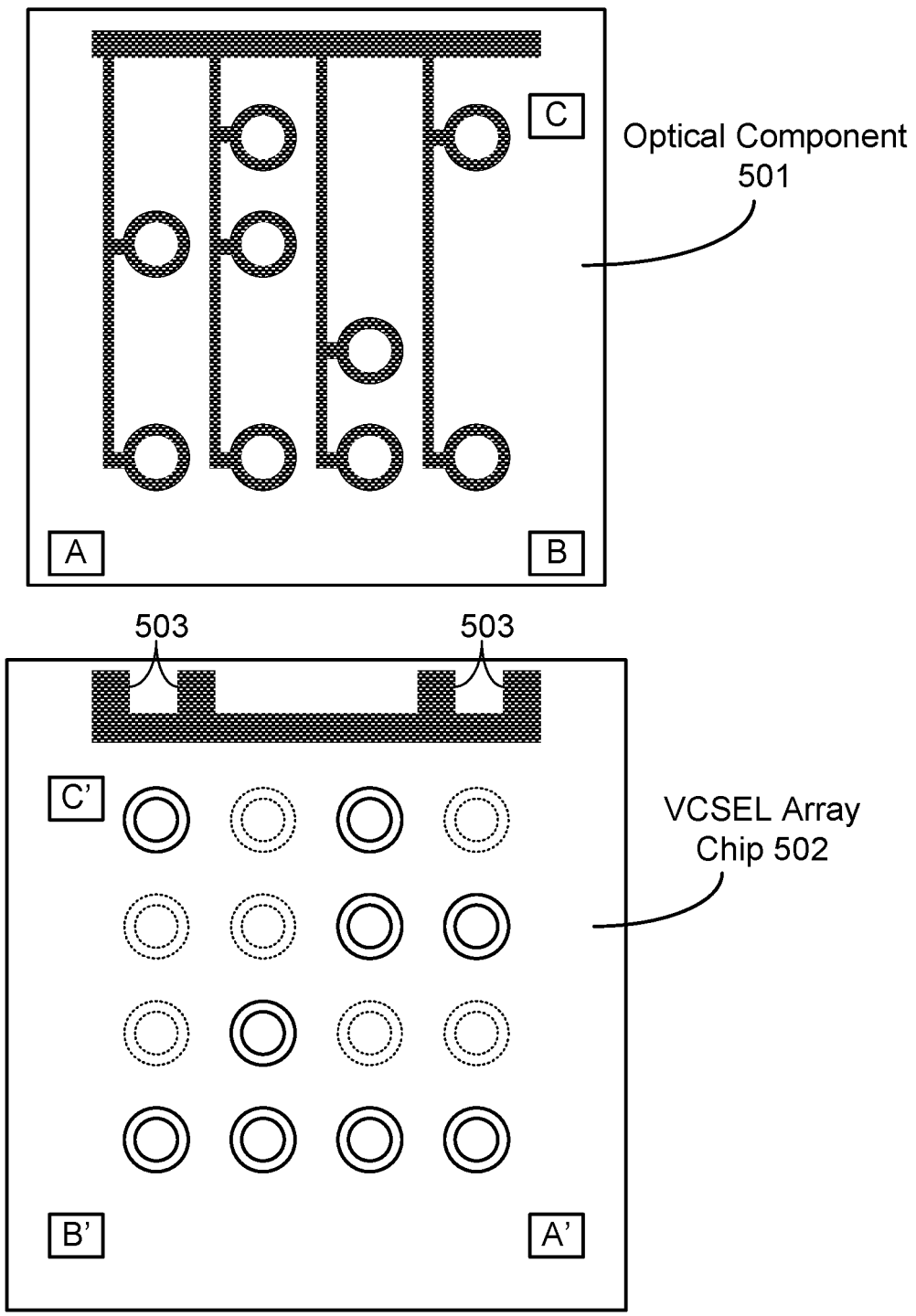
Figure 6:
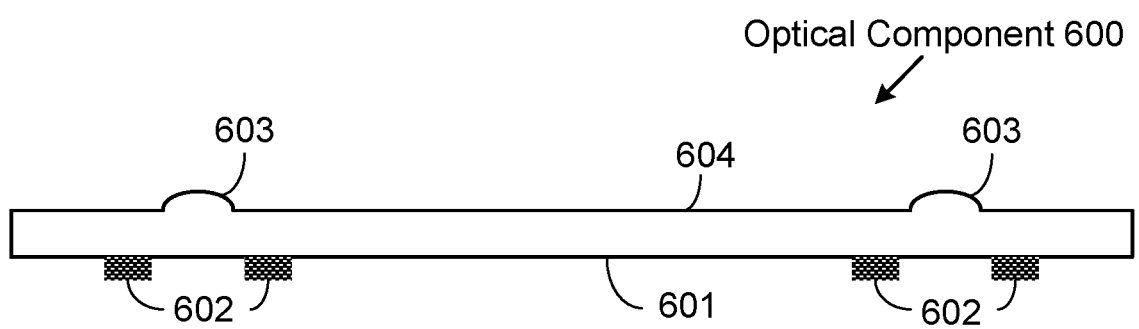
Figure 7:
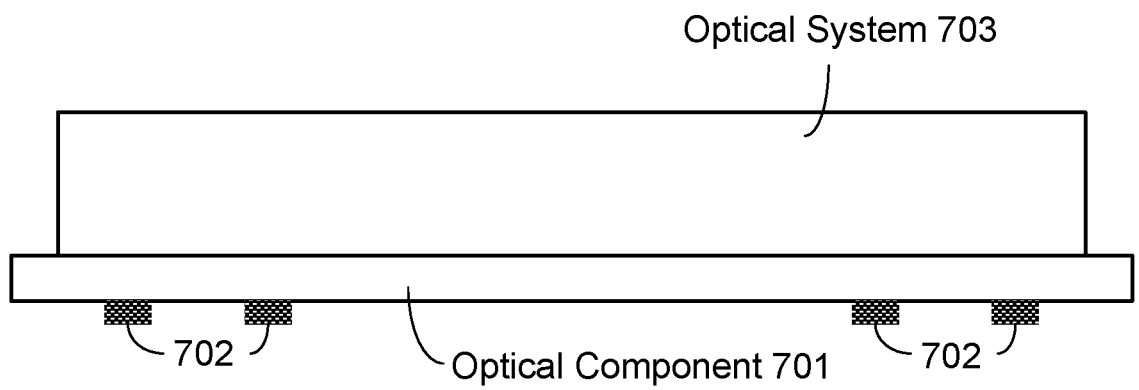
Figure 8:
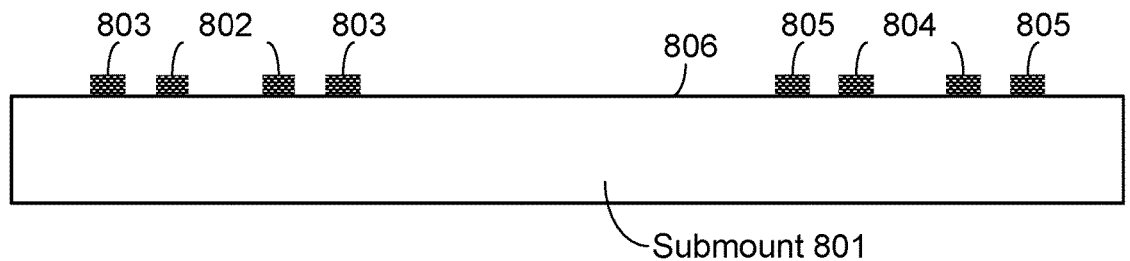

FIG. 1 illustrates a cross-sectional view of a prior art VCSEL array;

FIG. 2 illustrates a cross-sectional view of an exemplary VCSEL array, according to one embodiment of the present invention;

FIG. 3 illustrates a cross-sectional view of an exemplary optical component, according to one embodiment of the present invention;

FIG. 4 illustrates a cross-sectional view of an exemplary VCSEL array, according to one embodiment of the present invention;

FIG. 5 illustrates an exemplary optical component in a bottom view and an exemplary VCSEL chip in a top view, according to one embodiment of the present invention;

FIGS. 6 and 7 illustrate cross-sectional views of two exemplary optical components, according to two embodiments of the present invention;

FIG. 8 illustrates a cross-sectional view of an exemplary submount, according to one embodiment of the present invention.

Figure 9:
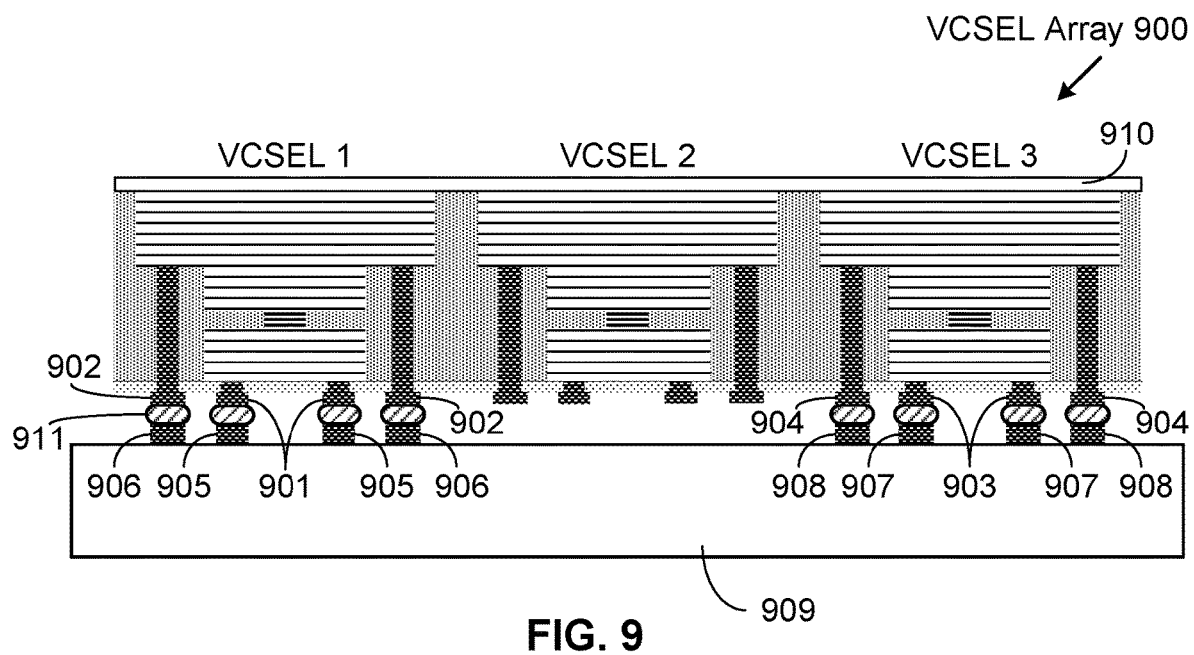

FIG. 9 illustrates a cross-sectional view of an exemplary VCSEL array, according to one embodiment of the present invention;

FIGS. 10.1 and 10.2 illustrate exemplary submounts in top views, according to two embodiments of the present invention;

FIGS. 11.1 and 11.2 illustrates cross-sectional views of a prior-art ion implantation process; and FIG. 12 illustrates a cross-sectional view of an exemplary VCSEL array, according to one embodiment of the present invention.

MODE FOR THE INVENTION

Mode for Invention

FIG. 1 illustrates a prior art VCSEL array 100 in a cross-sectional view. Array 100 comprises VCSELs 1, 2, and 3 on a substrate 106. It should be noted that the array 100 may comprise thousands of VCSELs and only three VCSELs are shown here for simplification purposes. Similarly, in other figures and descriptions below, only a few VCSELs or part of an array are shown for simplification purposes. VCSEL 1, 2, or 3 represents a VCSEL structure or VCSEL emitter which emits a laser beam when charged with an electrical current. As used herein, a VCSEL, VCSEL structure, and VCSEL emitter have the same meaning and may be used interchangeably. As shown, each VCSEL includes an active region 101 and reflector regions 102 and 103. For a typical VCSEL, active region 101 may contain a multiple-quantum-well (MQW), reflector region 102 may contain an n-type Distributed Bragg Reflector (DBR), and reflector region 103 may contain a p-type DBR. The quantum well and DBRs are grown on substrate 106 in an epitaxial process. Substrate 106 has n-type doping. Reflector regions 102 and 103 and substrate 106 are electrically conductive. An insulation layer 107 (e.g. Silicon Nitride) is deposited on the top surfaces of reflector regions 103 and a plurality of vias are etched on the insulation layer 107. Then, metal layer 104 is deposited on the insulation layer. Metal layer 105 is deposited on the bottom surface of substrate 106. Metal layers 104 and 105 serve as the anode and cathode terminals, respectively.

As shown in FIG. 1, the plurality of VCSELs share a common cathode but are separated by isolation trenches. Metal layer 104 is deposited to electrically connect all VCSELs. When the array is in operation or electrically charged, each VCSEL emitter generates a laser beam. These VCSEL emitters are arranged in a regular pattern. For purpose of illustration, a VCSEL array of a regular pattern may also be called a regular-patterned VCSEL array.

A regular pattern, as used herein, may mean various configurations that follow certain rules. Examples of regular patterns include elements with equal spacing in one or more rows, elements with equal spacing in rows and columns, elements with equal spacing in concentric circles, etc. An irregular pattern, as used herein, may mean various configurations which don't follow any rule. Irregular patterns include random or pseudorandom patterns.

FIG. 2 illustrates an exemplary VCSEL array 200 in a cross-sectional view, according to one embodiment of the present invention. VCSEL array 200 is manufactured by forming a plurality of VCSEL structures (including VCSELs 1, 2, and 3) on a substrate in a regular pattern and depositing a metal layer 204 under the substrate to serve as the shared cathode of the plurality of VCSEL structures. Up to this point, these manufacturing steps are accomplished by using the manufacturing process of a regular-patterned VCSEL array. Then, an insulation layer is deposited on top of the plurality of VCSEL structures. Here, different from the remaining fabrication steps of manufacturing a regular-patterned VCSEL array, contact vias including 201 and 203 are etched for only a selected number but not all of the VCSEL structures so that after a metal layer 205 is deposited, only the selected VCSEL structures having the vias are electrically connected. In one embodiment, the selected VCSEL structures form an irregular pattern. As shown, VCSELs 1 and 3 have vias 201 and 203 but VCSEL 2 does not. When an electrical current is applied to array 200 via the metal layers 204 and 205, VCSELs 1 and 3 are powered on but VCSEL 2 is not. Thus, a metal layer may be used to select VCSELs and VCSELs that are not selected become disconnected. Therefore, many patterns may be created based on a regular pattern, including irregular patterns, when part of the VCSELs of a regular pattern is selected by a metal layer. As can be seen, the manufacturing processes of VCSEL arrays of various irregular patterns can all start from the manufacturing process of the same regular-patterned VCSEL array and share the majority of fabrication processes. Only the final metallization step(s) is customized to achieve different irregular patterns. As such, manufacturing efficiency is increased, and cost is reduced.

FIG. 3 shows an exemplary optical component 300 in a cross-sectional view, which may be used to create a VCSEL array of an irregular pattern from a regular-patterned array. Optical component 300 may be made from a material which is transparent or substantially transparent at the wavelengths of interest. It has an upward facing surface 303 and a downward facing surface 301. Both surfaces may be coated with an antireflection layer to reduces reflection. Plating and lithographic processes may be used to create metal contact pads 302 on downward facing surface 301. The metal may be aluminum or copper. The contact pads are electrically connected by a metal layer deposited on surface 301 (not shown in the figure) and form a configuration which is a mirror image of an irregular pattern. After optical component 300 is mounted on a VCSEL array chip, contact pads 302 are connected to contacts of some but not all of the VCSELs. The VCSELs, which are electrically connected to the contact pads and thus connected together, form the irregular pattern.

In FIG. 4, an exemplary VCSEL array 400 is illustrated in a cross-sectional view. It comprises a VCSEL array chip and an optical component attached to the chip. The VCSEL array chip contains a plurality of VCSELs, including VCSELs 1, 2, and 3, configured in a regular pattern. The VCSEL array chip may be fabricated by using the manufacturing process of a regular-patterned VCSEL array but without the metallization that completes the connection of all VCSELs. The optical component has an upward facing surface 405 and a downward facing surface 406. Surface 406 faces the VCSEL array chip and has contact pads 403 which are arranged in a mirror image of a predetermined irregular pattern. The optical component is mounted on the VCSEL chip such that contact pads 403 are bonded with metal contacts 401 of the VCSEL array chip. Metal contacts 401 are contacts for the p-type DBRs of the VCSELs. Contacts 403 and 401 are bonded by an electrically conductive adhesive material 402. Material 402 may be cured at an elevated temperature. As shown in the figure, VCSELs 1 and 3 are selected and electrically connected to contact pads 403, but VCSEL 2 is not selected because the optical component does not have contact pad 403 corresponding to VCSEL 2. The VCSELs share a common cathode terminal 404. Since contact pads 403 are electrically connected to each other by a metal layer deposited on surface 406 (not shown in the figure), the anode terminals of VCSELs 1 and 3 are connected too. Thus VCSEL array 400 presents a pattern defined by contact pads 403, i.e., the predetermined irregular pattern. Therefore, various irregular patterns may be generated by selecting VCSELs from a regular VCSEL array using an optical component. In addition, mounting the optical component is accomplished during a packaging process. As packaging is less sophisticated than VCSEL chip fabrication which involves in epitaxy processes, the optical component method, as shown in FIG. 4, not only provides flexibility for making different irregular arrays, but also reduces cost.

FIG. 5 illustrates an exemplary optical component 501 and an exemplary VCSEL array chip 502, according to one embodiment of the present invention. The ring shaped objects represent metallic annular rings. Arranged on a downward facing surface of optical component 501, the annular rings are contact pads and represent a mirror image of a predetermined pattern, such as an irregular pattern. The contact pads are electrically connected to each other by a metal layer which contains bar-shaped connection lines made by metal plating. The annular rings on VCSEL array chip 502 represent metal contacts of the VCSELs. Each annular ring encircles a laser beam output window of a VCSEL. Bond pads 503 on chip 502 are arranged for wire bonding. Bond wires may be bonded to connect the anode terminals of the VCSELs to a contact pad on a submount which carries the chip. The annular rings illustrate a VCSEL array with a 4×4 matrix, which is an exemplary regular pattern. When optical component 501 is mounted on chip 502, markings A, B, and C are aligned to A', B', and C' respectively. After the mounting process, annular rings on the optical component are aligned and thus connected to some of the annular rings on the VCSEL chip. In the figure, the rings with solid lines represent VCSELs selected by the optical component. The rings with dotted lines are VCSELs which are not selected and become disconnected. The selected VCSELs present the predetermined pattern. Thus when an optical component carries an irregular pattern in a mirror image, the irregular pattern may be transferred to a VCSEL array in a packaging process.

FIGS. 6 and 7 depict two exemplary optical components in cross-sectional views. An optical component 600 comprises two surfaces 601 and 604. Surface 601 has metallic contact pads 602 as discussed above. Contact pads 602 are electrically connected by a metal layer deposited on surface 601 (not shown in the figure). Surface 604, on the other hand, has protruded structures 603 in a convex lens shape. Structure 603 make an output beam from a VCSEL less divergent and may have applications in certain cases. When there are more needs, an optical system may be added to an optical component. FIG. 7 shows such an example. An optical component 701 may resemble those as aforementioned. It has metallic contact pads 702 on a downward facing surface. Contact pads 702 are electrically connected by a metal layer deposited on the downward facing surface (not shown in the figure). Attached to the other surface is an optical system 703. The two parts, 702 and 703, may be considered as a subassembly or an upgraded optical component. System 703 may contain complex lens systems and other optical elements. Thus an optical component may provide certain functionalities besides creating a VCSEL array with an irregular pattern. In addition, as the subassembly may be manufactured in advanced or outsourced, it may increase production efficiency and cut cost and turnaround time further.

FIG. 8 illustrates an exemplary submount 801 in a cross-sectional view, according to the present invention. In above discussions, VCSELs are of the top-emitting type, which means that laser beams are emitted through the p-type DBR in a direction opposite to the substrate. In some other cases, a VCSEL chip is turned upside down and packaged using flip-chip methods. For a VCSEL chip with flip-chip bonding, output laser beams go through the substrate and the chip's contact regions face downward towards a submount. In such situations, a submount may be used to create a VCSEL array with an irregular pattern from a regular array. The submount may work in a similar way to an optical component as shown in the above examples.

Submount 801 has contacts pads 802, 803, 804, and 805 on an upward facing surface 806. The pads may be deposited using plating and lithographic techniques. Pads 802 and 804 are electrically connected by a metal layer deposited on surface 806 (not shown in the figure). Pads 803 and 805 are electrically connected by another metal layer deposited on the surface (not shown in the figure). The two metal layers are electrically insulated from each other and may be parts or portions of a single metal layer or separate metal layers deposited respectively. Pads 802 and 804 are used to electrically connect anode terminals of selected VCSELs on a VCSEL array chip. Pads 803 and 805 are used to electrically connect cathode terminals of the selected VCSELs. Thus anode and cathode terminals of the selected VCSELs may be electrically connected respectively by a submount. Pads 802 and 804 (or pads 803 and 805) may show an image of a predetermined irregular pattern. The image may be used to create a VCSEL array with the predetermined irregular pattern.

FIG. 9 illustrates an exemplary VCSEL array 900 in a cross-sectional view, according to the present invention. A VCSEL array die is flip-chip bonded on a submount 909. Before the die is flipped, its substrate portion is etched and an antireflection layer 910 is deposited to reduce reflection of output laser beams. The die comprises VCSELs 1, 2, and 3. Metal contacts 901 and 903 are the anode terminals which are connected to the p-type DBRs of VCSELs 1 and 3. Metal contacts 902 and 904 are the cathode terminals which are connected to the n-type DBRs of VCSELs 1 and 3. Metal contacts 901, 902, 903, and 904 are bonded and connected to contact pads 905, 906, 907, and 908 respectively by an electrically conductive adhesive material 911. Contact pads 905 and 907, which are aligned with metal contacts 901 and 903 respectively, are electrically connected by a metal layer on submount 909 (not shown in the figure). Contact pads 906 and 908, which are aligned with metal contacts 902 and 904 respectively, are electrically connected by another metal layer on submount 909 (not shown in the figure). The two metal layers may be fabricated as two electrically insulated portions of the same metal layer or different metal layers deposited in a sequential manner. Hence, metal contacts 901 and 903 are electrically connected by corresponding contact pads, and so are metal contacts 902 and 904. In other words, the anode terminals of VCSELs 1 and 3 are electrically connected by a metal layer on submount 909 and so are the cathode terminals of VCSELs 1 and 3 by another metal layer on the submount. Thus submount 909 may be used to select VCSELs from a regular array. The selected VCSELs have a predetermined pattern which is defined by the contact pads on the submount. Therefore, a submount may be used to select and connect VCSELs from a regular VCSEL array and create an array with an irregular pattern. The submount method has similar merits and advantages to the optical component method.

FIG. 10.1 illustrates an exemplary submount 1000 in a top view, according to the present invention. The concentric rings may represent a pair of metallic contact pads deposited on the submount. The inner rings or outer rings may form a predetermined pattern, such as an irregular pattern, on the submount. The inner ring may represent a contact pad to be connected to an anode terminal of a VCSEL. The outer ring may represent a contact pad to be connected to a cathode terminal of a VCSEL. Metal layers 1001 and 1002 may be two electrically insulated portions of a metal layer. The inner rings, to be connected to VCSELs' anode terminals, are electrically connected by metal layer 1001. The outer rings, to be connected to VCSELs' cathode terminals, are electrically connected by metal layer 1002. Metal layers 1001 and 1002 may be deposited on the submount by plating and lithographic methods.

Submount 1000 is designed to convert a VCSEL array from a 4×4 matrix configuration, i.e., a regular pattern, to a predetermined pattern. After a 4×4 VCSEL array is mounted on submount 1000, each pair of the inner and outer rings are connected to a ring-shaped anode and cathode terminals of a VCSEL. Thus not all VCSELs of the array are connected and get involved in forming a new array. Only the connected VCSELs are selected to form an array with a pattern defined by the submount. When an electrical current is charged through metal layers 1001 and 1002, only the selected VCSELs, which are connected to the pairs of the metallic rings, are turned on. When the ring configuration on the submount is a predetermined irregular pattern, the VCSELs, which are connected to the rings, form the predetermined irregular pattern. Therefore, a VCSEL array with a regular pattern may be turned into an array with an irregular pattern using the submount method.

FIG. 10.2 illustrates an exemplary submount 1003 in a top view, according to the present invention. Again, the concentric rings may represent a pair of metallic contact pads deposited on the submount. The inner rings or outer rings may form a predetermined pattern, such as an irregular pattern, on the submount. The inner ring may represent a contact pad to be connected to an anode terminal of a VCSEL. The outer ring may represent a contact pad to be connected to a cathode terminal of a VCSEL. The inner rings, to be connected to VCSELs' anode terminals, are electrically connected by a first metal layer which is embedded in an insulation layer beneath the surface. The first metal layer has a contact area 1004 on the submount. The outer rings, to be connected to VCSELs' cathode terminals, are electrically connected by a second metal layer which is embedded in the insulation layer too. The second metal layer has a contact area 1005 on the submount. The first and second metal layers may be fabricated as two electrically insulated portions of the same metal layer or different metal layers deposited in a sequential manner. Contact areas 1004 and 1005 may be used as bonding pads for wire bonding. Because the first and second metal layers are beneath the surface, more room is created for configuring the rings. As a result, the density of rings may be increased and a denser VCSEL array may be used to create an array of a predetermined pattern, such as an irregular pattern.

FIGS. 11.1 and 11.2 show a prior art processing technique. In an epitaxial growth process, an n-type DBR reflector region 1103, an MQW active region 1102, and a p-type DBR reflector region 1101 are formed on a n-type substrate 1104. VCSELs or VCSEL arrays may be fabricated based on the epitaxial structure. In FIG. 11.2, a region 1105 is created by ion implantation. The implanted ions create crystal vacancies which cause damage to the structure and render the implanted region nonconductive. Ion implantation is routinely used to create an isolation trench surrounding a VCSEL. The trench electrically isolates a VCSEL from other devices on a chip.

FIG. 12 illustrates an exemplary VCSEL array 1200 in a cross-sectional view, according to the present invention. VCSEL array 1200 comprises VCSELs 1, 2, and 3 originally. Before metal layer 1202 is deposited to electrically connect the VCSELs, ions are implanted in the DBR reflector regions of VCSEL 2. The ion implantation damages or disables the VCSEL. Thus, ion implantation method may be used to disable a selected number of VCSELs and to make the remaining VCSELs form a predetermined pattern, including an irregular pattern. For instance, during the fabrication process of the VCSEL array 1200, with lithographic techniques, windows may be created which correspond to VCSELs to be disabled. Then ion implantation takes place. And then a metal layer 1202 is deposited. Metal layer 1202 connects contact regions of all VCSELs regardless whether a VCSEL is disabled or not. Thus metal layer 1202 works with arrays of any patterns. VCSEL array 1200 is powered on when an electrical current is applied via anode terminal 1202 and a cathode terminal 1203. As such, except the ion implantation step(s), other masks and steps used in the manufacturing process remain the same irrelevant to the final irregular pattern to be manufactured. Therefore, the present invention has the benefit of reducing cost and turnaround time.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The invention claimed is:

1. A Vertical Cavity Surface Emitting Laser (VCSEL) array, comprising:
a substrate;
a plurality of VCSEL structures formed on the substrate in a regular pattern, each VCSEL structure being top-emitting and comprising a first reflector region, an active region, and a second reflector region;
a metal layer that electrically connects a selected number but not all of the VCSEL structures so that the selected number of the VCSEL structures form a predetermined irregular pattern of light emitters when the VCSEL array is electrically charged; and
an optical component, wherein the metal layer is formed on the optical component and the optical component is fixed with the VCSEL structures in a packaging process.

2. The VCSEL array of claim 1, wherein the regular pattern comprises a plurality of rows and VCSEL structures in each row are spaced apart in equal distance.

3. The VCSEL array of claim 1, wherein the regular pattern comprises a plurality of concentric circles and VCSEL structures in each circle are spaced apart in equal distance.

4. The VCSEL array of claim 1, wherein the predetermined irregular pattern is a random or pseudorandom pattern.

5. The VCSEL array of claim 1 further comprises a different contact for each VCSEL structure.

6. The VCSEL array of claim 1, wherein the optical component is bonded with the VCSEL structures in the packaging process.

7. The VCSEL array of claim 1 [6], wherein the optical component comprises a plurality of optical lenses or an optical system.

8. The VCSEL array of claim 1 further comprises vias etched only for the selected VCSEL structures.

9. The VCSEL array of claim 8, wherein the metal layer electrically connects the selected VCSELs through the vias.

10. The VCSEL array of claim 1, wherein the active region comprises a multiple-quantum-well (MQW), the first reflector region comprises an n-type Distributed Bragg Reflector (DBR), and the second reflector region comprises a p-type DBR.

11. A Vertical Cavity Surface Emitting Laser (VCSEL) array, comprising:
a submount;
a plurality of VCSEL structures formed in a regular pattern, each VCSEL structure comprising a first reflector region, an active region, and a second reflector region, wherein the plurality of VCSEL structures are mounted on the submount via flip-chip method; and
a first metal and a second metal that electrically connect anode and cathode terminals of a selected number but not all of the VCSEL structures respectively so that the selected number of the VCSEL structures form a predetermined irregular pattern of light emitters when the VCSEL array is electrically charged, wherein the first metal and the second metal are formed on the submount.

12. The VCSEL array of claim 11, wherein the first metal and the second metal are deposited on the submount before the VCSEL structures are mounted on the submount during a packaging process.

13. The VCSEL array of claim 11 further comprises a different contact for each of the selected VCSEL structures, wherein the first metal and the second metal electrically connect the anode and cathode terminals of the selected VCSEL structures via the contacts.

14. The VCSEL array of claim 11, wherein the regular pattern comprises a plurality of rows and VCSEL structures in each row are spaced apart in equal distance.

15. The VCSEL array of claim 11, wherein the irregular pattern comprises a random pattern or pseudorandom pattern.

16. A method for manufacturing a Vertical Cavity Surface Emitting Laser (VCSEL) array, comprising:
forming a plurality of VCSEL structures in a regular pattern on a substrate, each VCSEL structure comprising a multiple-quantum-well (MQW), an n-type Distributed Bragg Reflector (DBR), and a p-type DBR;

disabling a selected number of the plurality of VCSEL structures so that remaining VCSEL structures form a predetermined irregular pattern of light emitters when the VCSEL array is electrically charged, wherein the disabling step comprises using ion implantation to disable the selected number of the plurality of VCSEL structures;

forming a different via for each of the remaining VCSEL structures; and forming a metal layer to electrically connect the remaining VCSEL structures through the vias.

17. The method of claim 16, wherein the metal layer further connects at least a part of the selected number of the plurality of VCSEL structures.

18. The method of claim 16, wherein the regular pattern comprises a plurality of rows and VCSEL structures in each row are spaced apart in equal distance.

19. The method of claim 16, wherein the irregular pattern comprises a random pattern or pseudorandom pattern.

\* \* \* \* \*